United States Patent
Mirowski et al.

(10) Patent No.: US 6,985,343 B2
(45) Date of Patent: Jan. 10, 2006

(54) PROGRAMMABLE POWER MANAGEMENT SWITCH

(75) Inventors: Marian Mirowski, West Bloomfield, MI (US); Charlie T Accad, Warrren, MI (US); Gary Burlak, Lake Orion, MI (US)

(73) Assignee: DaimlerChrysler Corporation, Auburn Hills, MI (US)

( * ) Notice: Subject to any disclaimer, the term of this patent is extended or adjusted under 35 U.S.C. 154(b) by 281 days.

(21) Appl. No.: 10/126,024

(22) Filed: Apr. 19, 2002

(65) Prior Publication Data

US 2003/0197993 A1    Oct. 23, 2003

(51) Int. Cl.
    *H02H 9/08*    (2006.01)
(52) U.S. Cl. ................................. 361/93.2; 361/93.9
(58) Field of Classification Search ...... 361/91.1–91.3, 361/93.1, 86–88, 100–103, 18, 93.2, 93.7, 361/93.8, 93.9
    See application file for complete search history.

(56) References Cited

U.S. PATENT DOCUMENTS

| | | | | |
|---|---|---|---|---|
| 4,943,761 A | * | 7/1990 | Fox et al. .................... | 323/283 |
| 5,696,975 A | * | 12/1997 | Moore et al. ................ | 717/168 |
| 5,793,596 A | * | 8/1998 | Jordan et al. ................. | 361/98 |
| 5,894,394 A | * | 4/1999 | Baba et al. .................... | 361/87 |
| 6,011,416 A | * | 1/2000 | Mizuno et al. ............. | 327/108 |
| 6,320,275 B1 | * | 11/2001 | Okamoto et al. .......... | 307/10.1 |
| 6,594,129 B1 | * | 7/2003 | Baba et al. .................... | 361/87 |

OTHER PUBLICATIONS

"Quad High Side and Octal Low Side Switch for Automotive", *Motorola Semiconductor Technical Data*, Rev. 1.6, Jun. 2001.

* cited by examiner

*Primary Examiner*—Brian Sircus
*Assistant Examiner*—Danny Nguyen
(74) *Attorney, Agent, or Firm*—Ralph E. Smith

(57) ABSTRACT

A power management switch arrangement can be programmed by an external switch controller to alter the operating parameter limits used for fault detection. The switch arrangement includes the capability for full diagnostic feedback of load current and over-temperature conditions.

17 Claims, 4 Drawing Sheets

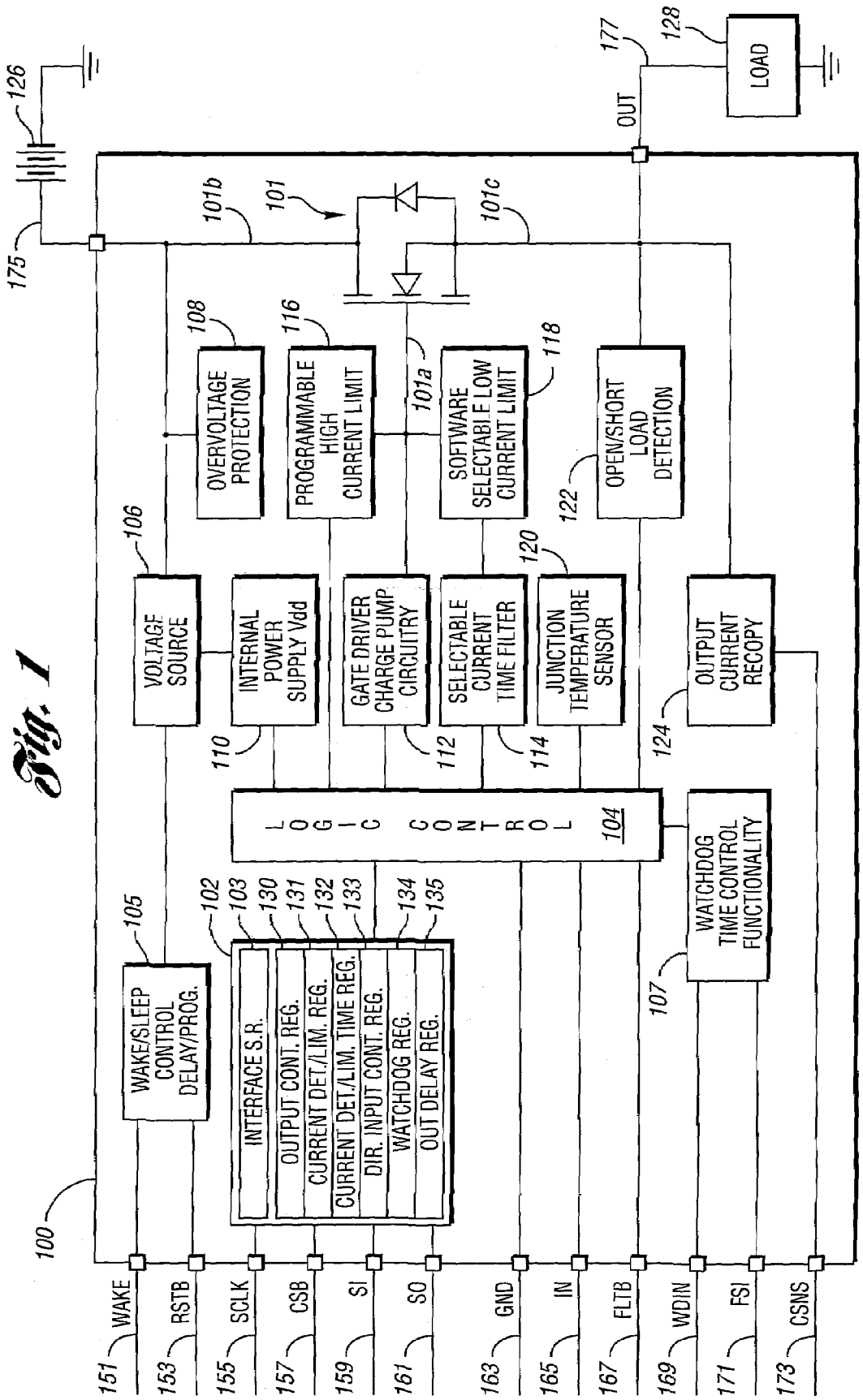

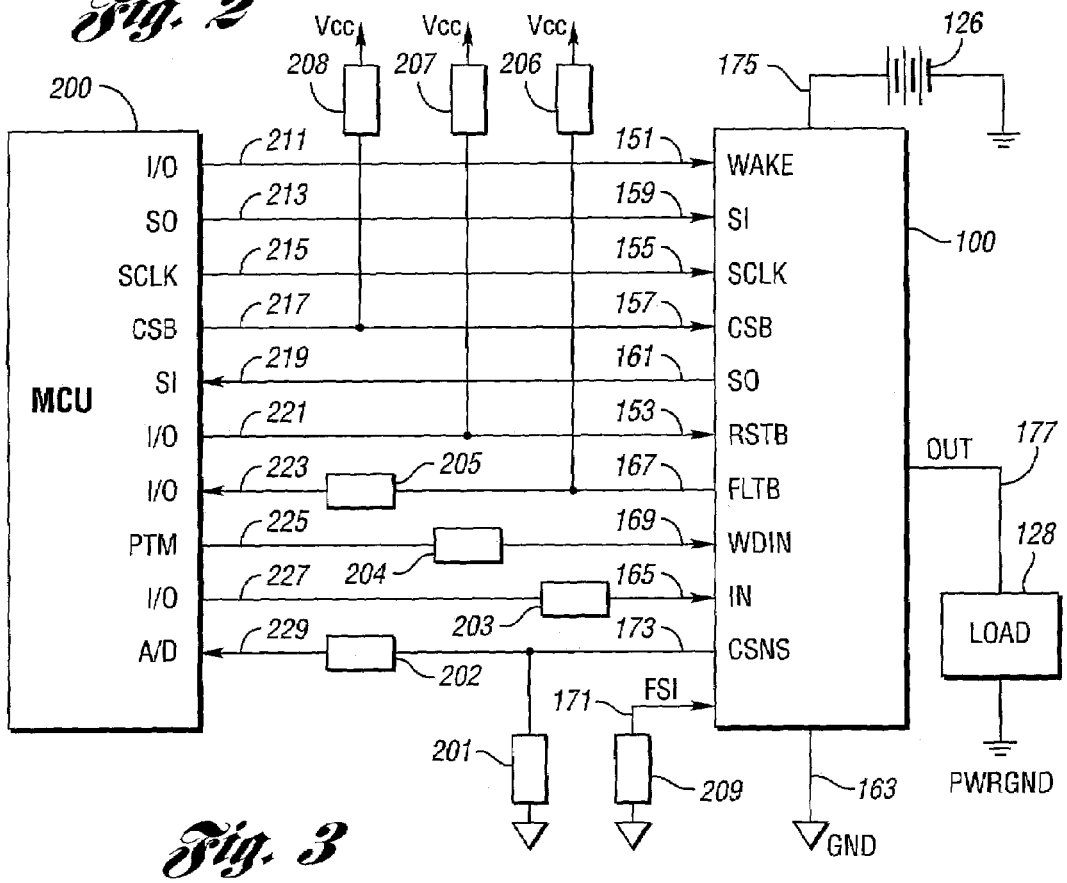

| SO OUTPUT BIT ASSIGNMENT DEVICE STATUS RETURN FORMAT | | |
|---|---|---|
| BIT SIG | SI MESSAGE BIT | MESSAGE DESCRIPTION |
| MSB | OD7 = 0 | REFLECTS THE STATE OF THE WATCHDOG BIT FROM THE PREVIOUSLY CLOCKED IN MESSAGE. |
| | OD6 | THIS BIT WILL REFLECT THE STATE OF THE WAKE INPUT. |
| | OD5 | THIS BIT WILL REFLECT THE STATE OF THE IN INPUT. |
| | OD4 | THIS BIT WILL REFLECT THE STATE OF THE FSI INPUT. |
| | OD3 | THIS BIT WILL REFLECT THE FAULT OF THE OUTPUT (1 IF FAULT). |
| | OD2 | THIS BIT IS USED TO DETERMINE THE FAULT TYPE. |
| | OD1 | THIS BIT IS USED TO DETERMINE THE FAULT TYPE. |
| LSB | OD0 | THIS BIT IS USED TO DETERMINE THE FAULT TYPE. |

*Fig. 4a*

| FAULT IDENTIFICATION | | | | |
|---|---|---|---|---|
| OD3 | OD2 | OD1 | OD0 | FAULT TYPE |
| 0 | X | X | X | NONE |
| 1 | 0 | 0 | 0 | OVER TEMP |
| 1 | 0 | 0 | 1 | CURRENT LIMIT |
| 1 | 0 | 1 | 0 | OVER CURRENT |
| 1 | 0 | 1 | 1 | OPEN |
| 1 | 1 | 0 | 0 | UNDER VOLTAGE |
| 1 | 1 | 0 | 1 | OVER VOLTAGE |

*Fig. 4b*

| SO OUTPUT BIT ASSIGNMENT DEVICE REGISTER READ BACK FORMAT | | |
|---|---|---|
| BIT SIG | SO MESSAGE BIT | MESSAGE DESCRIPTION |
| MSB | OD7 = 1 | REFLECTS THE STATE OF THE WATCHDOG BIT FROM THE PREVIOUSLY CLOCKED IN MESSAGE. |
| | OD6 | REGISTER ADDRESS BIT. |
| | OD5 | REGISTER ADDRESS BIT. |
| | OD4 | REGISTER ADDRESS BIT. |
| | OD3 | THIS BIT WILL REFLECT THE FAULT OF THE OUTPUT (1 IF FAULT). |
| | OD2 | RETURNED DATA MSB OR NULL. |
| | OD1 | RETURNED DATA OR NULL. |
| LSB | OD0 | RETURNED DATA LSB OR NULL. |

Fig. 5

| FAILSAFE OPERATION AND TRANSITIONS TO OTHER MODES | | | | |
|---|---|---|---|---|
| WAKE | RSTB | WDTO | OUT | COMMENTS |
| 0 | 0 | X | OFF | DEVICE IS IN SLEEP MODE |
| 1 | 0 | NO | OFF | OUTPUT IS OFF, WHEN RSTB TRANSITIONS TO LOGIC 1, DEVICE IS IN NORMAL MODE |
| 1 | 0 | YES | ON | FAILSAFE MODE, DEVICE RESET INTO SLEEP MODE BY TRANSITIONING WAKE TO LOGIC 0 |
| 0 | 1 | NO | S | DEVICE IN NORMAL OPERATING MODE |
| 0 | 1 | YES | ON | FAILSAFE MODE, DEVICE RESET INTO SLEEP MODE BY TRANSITIONING RSTB TO LOGIC 0 |
| 1 | 1 | NO | S | DEVICE IN NORMAL OPERATING MODE |
| 1 | 1 | YES | ON | FAILSAFE MODE, DEVICE RESET BY TRANSITIONING RSTB & WAKE TO LOGIC 0 |

Fig. 6

PROGRAMMABLE POWER MANAGEMENT SWITCH

FIELD OF THE INVENTION

The invention generally concerns power switches for controlling delivery of electrical energy to a load. More specifically, the invention pertains to a processor-compatible power management switch with programmable fault limit conditions and diagnostic feedback of switch operating conditions.

BACKGROUND OF THE INVENTION

Mechanical elements, such as electromechanical relays and fuses, have traditionally been used for switching and/or protecting power sources to various loads. Such devices are prone to mechanical failures at unacceptably high rates.

Electronic or solid state switches have evolved and have been incorporated into power management switching arrangements, principally to take advantage of higher speeds and substantially lower failure rates as compared to their mechanical forerunners. Traditionally, however, these newer solid state switches are of fixed operating design for a particular application. For example, depending upon the nature of the load and the power supply, fixed operating limits, such as maximum allowable current, or excess operating current, are based on fixed levels against which the operating parameters of the power switching arrangement are compared.

There is an evolving need for more universal power management switch arrangements which can be programmed for variable fault detection limits and for power requirement delivery profiles as a function of a particular application.

SUMMARY OF THE INVENTION

Accordingly, in one aspect of the invention, a power switch for selectively coupling a voltage source to a load features an improvement including a detector adapted to be coupled to the load for monitoring and comparing a preselected operating condition to a limit value, and programmable means for setting the limit value in accordance with data received from a control source.

In another aspect of the invention, a programmable switch for selectively coupling an energy source to a load includes an interface adapted to receive input instructions from a switch controller, and a plurality of addressable data registers coupled to the interface for controlling the switch in accordance with the input instructions so as to couple or uncouple the energy source to or from the load.

In a further aspect of the invention, a power switch for selectively coupling a voltage source to a load includes an input message port adapted to be coupled to a switch controller, an output adapted to be coupled to the load, a switching element adapted to be coupled between the voltage source and the output, a detector element coupled to the switching element for detecting a preselected operating condition, and logic circuitry coupled to the input message port and to the detector element and operative to set a threshold level against which the detector element compares the preselected operating condition, the threshold level being programmable in accordance with data received at the input message port.

BRIEF DESCRIPTION OF THE DRAWINGS

The objects and features of the invention will become apparent from a reading of a detailed description of a preferred embodiment taken in conjunction with the drawing, in which:

FIG. 1 is a functional block diagram of a power management switch arranged in accordance with the principles of the invention;

FIG. 2 is a functional block diagram demonstrating connections between the power management switch of FIG. 1 and a microprocessor-based switch controller;

FIG. 3 is a table describing the format of input messages forwarded to the power management switch of the invention from a switch controller;

FIGS. 4a and 4b are tables describing the format of output messages sent from the power switch of the invention to the switch controller;

FIG. 5 is a table describing a format of a power management switch output message for a switch register read-back mode; and FIG. 6 is a table describing switch input and output states for a fail-safe mode of operation.

DETAILED DESCRIPTION

General Functional Organization

FIG. 1 sets forth a block functional diagram of a high-side power switch which is microprocessor compatible and which provides full digital diagnostic feedback of current monitor sensing and over temperature conditions. With reference to FIG. 1, power management switch arrangement 100 utilizes as its main switching element solid state switch 101, which, for example, could comprise a metal oxide silicon field effect transistor (MOSFET). MOSFET 101 selectively couples a source of energy such as a battery 126 via input pin 175 to an output pin 177 which, in turn, is coupled to load 128. Alternatively, an insulated gate bipolar transistor (IGBT) could be utilized as the solid state switch 101.

Arrangement 100 has an activation or WAKE pin 151 and a reset pin 153 coupled as inputs to WAKE/SLEEP CONTROL 105. Control 105 is coupled to electronics voltage source 106, which is, in turn, coupled to internal power supply 110, over-voltage protection circuit 108 and battery pin 175.

Serial clock input 155, chip select input 157 and serial message input port 159 are coupled as inputs to interface unit 102. Serial output message port 161 is coupled as an output from interface 102. The major element of interface 102 is a serial in/serial out shift register 103 which receives input messages at pin 159 and relays output messages via pin 161. Additionally, interface 102 includes a series of addressable registers coupled to the data stages of the interface shift register 103. These registers, which will be further described herein below, are output control register 130, current detection limit register 131, current detection timing register 132, direct input control register 133, watchdog timer register 134, and output delay register 135.

Interface unit 102 is coupled to combinatorial logic control circuitry 104. Also coupled to logic control 104 is circuit ground pin 163, power management switch input 165, and fault indication output pin 167.

Additional inputs to power switch management arrangement 100 include a watchdog input pin 169 and a fail-safe enable pin 171 which are coupled to watchdog time control circuitry 107. Output 173 is the current sense output of arrangement 100 which is coupled to output current recopy circuitry 124. Circuitry 124 monitors the output current to load 128 and generates a signal representative of this current output level at pin 173.

Logic control 104 is coupled to internal power supply 110, programmable high current limit detector 116, MOSFET gate driver charge pump circuitry 112, a selectable current time filter 114, junction temperature sensor 120, open/short load detection circuitry 122 and watchdog timer circuitry 107.

Gate driver circuitry 112 is coupled to a gate of MOSFET 101 while current time filter 114 is coupled to a software selectable low current limit detector 118. The programmable high current limit detector 116 and the low current limit detector 118 are each coupled to the gate 101a of MOSFET 101. Detection circuitry 122 is coupled to the output 177 of switch arrangement 100.

In accordance with signals generated by gate driver circuitry 112, MOSFET 101 establishes a current conducting path between its source and drain terminals 101b and 101c for selectively coupling energy source 126 to load 128 via output pin 177.

The programmable nature of switch arrangement 100 of FIG. 1 requires compatibility with a programming mechanism. In the preferred embodiment, such a mechanism comprises a microprocessor-based switch controller. With reference to FIG. 2, switch controller 200 is interconnected with power management switch arrangement 100 for passing control information to and receiving diagnostic and status information from arrangement 100.

I/O pin 211 of switch controller 200 is coupled to input 151 of switch 100. Serial output 213 of controller 200 is coupled to serial input 159 of switch 100. Serial clock output 215 of controller 200 feeds serial clock input 155 of switch 100, while chip select output 217 of controller 200 is coupled to chip select input 157 of switch 100.

Serial output 161 of switch arrangement 100 is coupled to serial input 219 of the switch control unit 200. I/O lead 221 of controller 200 is coupled to reset input 153 of switch 200, while fault indication lead 167 of arrangement 100 is coupled via resistor 205 to I/O lead 223 of controller 200. I/O 227 of controller 200 is coupled via resistor 203 to switch 100's input 165, while PTM lead 225 of controller 200 is coupled via resistor 204 to watchdog timer input 169 of arrangement 100. Current sense output 173 of switch 100 is coupled via resistor 202 to analog-to-digital input 229 of controller 200. Resistors 201 and 209 couple logic ground to failsafe input 171 and current sense output 173, respectively, of arrangement 100. Resistors 206, 207 and 208 respectively couple logic voltage supply $V_{cc}$ to output 167 of switch 100, input 153 of switch 100 and input 157 of switch 100.

With further reference to FIGS. 1 and 2, the various inputs and outputs of switching arrangement 100 may be summarized, as follows. Lead 163 serves as the ground for the logic portion of switch 100. Battery voltage is supplied at lead 175. Lead 177 is the protected high-side power output to load 128. Sense current output lead 173 delivers a ratioed proportional amount of the high-side output currents that can be used to generate output voltages representative of such currents. Lead 171 determines the state of the power switch's output 177 after a watchdog timeout occurs. If the fail-safe lead 171 is left to float to a logic high state, then output 177 will turn on when in the fail-safe state. If fail-safe pin 171 is tied to ground, then the watchdog circuit and fail-safe operation will be disabled.

Wake input pin 151 starts device 100's watchdog timeout when brought to a logic high state. Watchdog input pin 169 is used to monitor system operation. If the incoming watchdog signal does not transition within a normal watchdog timeout period, then switching arrangement 100 will operate in a fail-safe mode.

Fault indication output 167 goes to an active logic low state whenever a fault mode is detected in device 100. The specifics of the type of fault is indicated via an output message on the serial output pin 161. The input pin 165 is used to directly control output 177. Input 165 may or may not be activated, depending upon the configured state of the internal logic of switching arrangement 100 to be described in a later section.

Serial input line 159 is connected to the serial data output 213 of master device 200 (FIG. 2) from which it receives output command data. Input 159 receives serial data transmitted in an eight-bit protocol to be described in a later section. The master control unit 200 will ensure that data is available at a predetermined transition of the serial clock supplied to device 100 via input 155. The serial clock input 155 is connected to the serial clock 215 of master device 200 which functions as a bit shift clock for the shift register 103 of interface device 102.

Chip select input 157 provides an enabling input for switch arrangement 100 whenever this input goes to a logic low state.

Serial output lead 161 is connected to the serial data input 219 of switch controller 200. Output data carried on lead 161 provides fault information whenever device 100 is accessed by controller 200. Last, reset lead 153 is used to initialize device 100's configuration and fault registers, as well as to place arrangement 100 in a low current standby mode. Reset lead 153 additionally starts the watchdog timeout when it transitions from a logic low to a logic high state.

Interface Functions

In the preferred embodiment, communication between power switch arrangement 100 and external switch controller 200 (FIG. 2) is effected via messages comprised of one or more 8-bit words transmitted serially by master controller 200 for incoming messages. Each incoming command message on the serial input lead 159 is interpreted using the message bit assignments set forth in the table of FIG. 3. With reference to FIG. 3, the most significant bit, D7, is the watchdog bit. The next three bits, D6–D4, determine a control register address to select one of the control registers of the interface (registers 130–135 of FIG. 1). The remaining four bits, D3–D0, are used to configure switching arrangement 100 and its protection features.

The watchdog bit D7 state is used to select one of two modes of operation. If D7 is 0, then power switch arrangement 100 is placed in the register program mode. If D7 is 1, then the power switch arrangement 100 is placed in the register readback mode. In both operational modes, register address bits D6, D5, D4 are used to select one of the control registers in interface 102.

The three-bit register address set forth in FIG. 3 can specify eight possible register addresses, six of which are used in this embodiment.

If the register address is 000, output control register 130 is selected to allow the master controller 200 to control the power switch output 177 via the interface 102. Incoming message bit D0 reflects, under output control register mode, the desired state of high-side output 177, with a logic 1 enabling output switch 101 and a logic 0 turning switch 101 off or to the high impedance state. A logic 1 on message bit D1 enables the current sense output 173, while a logic 0 disables it. A logic 1 on bit D2 enables open load detection 122 (FIG. 1) while a logic 0 disables it. Bit D3 is forced to logic 0 in the output control register mode.

With D7 equal to 0 and address bits D6–D4 equal to 001, the current detection and limitation register 131 is specified. Register 131 enables the master controller 200 to configure the output over-current detection level and the current limitation level of switching arrangement 100. In addition to protecting device 100, this register mode is used to optimize the load requirements to match system characteristics. Bits D2–D0 are used to set the over-current detection level to one of eight possible levels. Bit D3 is used to set the current limit level to one of two levels. The current limit level is that level of current above which a catastrophic failure may be indicated forcing the output 177 to be shut off from the load. A typical fault causing the device to exceed the current limitation level would be a short circuit at the load.

The over-current detection level is indicative of a trend or a "soft fault" where action short of total device shutdown may be considered. The programmable levels for these two types of fault indications enable the device 100 to be differently programmed for different applications.

With bit D7 at 0 and address bits D6–D4 equal to 010, the current detect and time limit register 132 is selected. This register 132 is used by the master controller 200 to determine the amount of time that device 100 will allow an over-current condition through switching device 101 before output 177 is latched to the off state. The time that is chosen will also determine the amount of time that will be required before device 100 automatically tries to turn back on. Bits D1 and D0 allow the master 200 to select one of four such time intervals.

With bit D7 at 0 and address bits D6–D4 equal to 011, the direct input control register 133 is selected. Register 133 is used by master 200 to enable direct input control of power switch output 177. A logic 0 on bit D1 will enable output 177 for direct control. A logic 1 on bit D1 will disable output 177 from direct control. In the direct input control register mode, a logic 1 on bit D0 along with logic 0 on bit D1, results in a Boolean AND of the input pin 165 with its corresponding D0 message bit when addressing the output control register 130. Similarly, a logic 0 on the D0 pin along with logic 0 on bit D1 results in a Boolean OR of the input 165 to the corresponding message bit when addressing the output control register. Register 133 is especially useful where several loads are to be independently controlled via pulse width modulation. For example, the inputs 165 of several devices can be configured to operate all of the outputs with one pulse width modulated output from the master device 200.

If each output is then configured to be Boolean ANDed to its respective input pin, then each output can be individually turned off via the interface while controlling all of the outputs which are commanded with a single pulse with modulated output.

With bit D7 set to 0 and address bits D6–D4 equal to 100, the watchdog configuration register 134 is selected. Register 134 is used by master 200 for configuring the watchdog time control functionality 107. The watchdog timeout period is configured using bits D1 and D0. This enables the selection of one of four different watchdog timeout periods.

With bit D7 set to 0 and address bits D6–D4 equal to 101, output switching delay register 135 is selected. Register 135 is used to specify a programmable time delay that is active only during transitions between normal and sleep modes of operation of the switching arrangement 100. Whenever the WAKE input 151 transitions from logic 0 to logic 1, output 177 will be held off for the time delay specified in register 135. Similarly, when the device 100 transitions to a sleep mode (a low current standby mode of operation) then output 177 will remain on for the time period specified in register 135. The four bits D3–D0 enable specification of one of 16 delay time intervals.

Hence, time-based load control may be generated where multiple loads coupled via power management switches 100 (FIG. 1) to a common master controller are utilized. Each switch 100 being commonly controlled by a single master 200 (FIG. 2) would have its own pre-programmed delay time before entering an active mode from the SLEEP state. In other words, during this delay time the switch will ignore commands to leave the SLEEP state. The use of this timing feature is intended to minimize current inrush or surges when several devices are being controlled by a common WAKE input, thereby allowing loads to be synchronously switched on or off.

Output Message Format

When the CSB input 157 is pulled to a logic low state, the status information in the interface shift register 103 is clocked out as the new message data is being clocked in to the shift register input lead 159. The output bit assignment in an output message at lead 161 is as set forth in the table of FIG. 4a. Message bit 7 reflects the state of the watchdog bit that was addressed during a previous output control register communication. Based on the state of the watchdog bit, the output data in the message will be either the current device status of power switching arrangement 100 or a requested register readback mode. If D7 is 0, the current device status is contained in the output bit stream. If D7 is 1, then the output stream will contain either no data or the data for a previous register readback mode request.

As seen from FIG. 4a, if the 7th, or most significant, bit is logic 0, then the following three bits OD6–OD4 will reflect the logic states of the WAKE 151, IN 165 and FSI 171 leads, respectively. The next bit, OD3, will indicate whether or not a fault state has been determined at the output 177 of device 100. If OD3 is a logic 1, the output 177 experienced a fault condition prior to device 100 being accessed by the chip select lead 157. If a fault is indicated, then the type of fault can be identified using the least three significant bits OD2–OD0 as set forth in the table of FIG. 4b.

An over-temperature fault indicated by OD2–OD0=000, results in the output 177 being turned off until the temperature, as detected by sensor 120 of FIG. 1, falls below a predetermined hysteresis temperature value from the over-temperature value originally detected in generating the fault indication.

Exceeding a programmable current limit is indicated by OD2–OD0=001. Under this condition, power switch 100 latches off for the programmed dead-time interval described above. The switch 100 then will attempt re-start after the programmed delay to check for the continued presence of this fault condition.

Exceeding a programmable over-current level for a programmable period of time is indicated by OD2–OD0=010. As mentioned above, the user can select one of eight over-current levels that, if exceeded for one of four selectable time periods, will result in the output 177 being latched off. Retries will then be attempted in accordance with a delay, or dead-time, equal to the same programmable time period.

An open load fault is indicated by OD2–OD0=011, and results in latching MOSFET 101 to the off, or high impedance state.

An under-voltage fault is indicated by OD2–OD0=100. If the power supply voltage at input 175 falls below a predetermined level, output 177 will turn off.

An over-voltage fault is indicated by OD2–OD0=101. The power switch will shut down and remain disabled until the over-voltage condition is removed by the voltage level falling to a preselected, acceptable hysteresis level.

As seen from the table of FIG. 5, when the output message bit 7 is a logic 1, device 100 is in the register readback mode. In this mode if the most significant message bit OD7 is a logic 1, then the following three most significant bits (OD6–OD4) will indicate the control register selected in the previous input message command. The table of FIG. 5 sets forth the register readback serial data format. If no data was requested in a previous input command, then OD6–OD4 will be set to all ones and bits OD2–OD0 will be set to all zeros.

With OD6–OD4 equal 000, then the data in bits OD2–OD0 will reflect the current state of output control register 131 and will be interpreted in accordance with the original bit definitions as set forth above with reference to FIG. 3. If bits OD6–OD4 equal 001, the data in bits OD2–OD0 will contain the programmed over-current detection level. If OD6–OD4 equals 010, the data returned in bits OD1 and OD0 will be the current programmed value for one of four over-current blanking times as described above. Bit OD3 will contain the device setting for one of two programmable current limit levels also as described above.

If address bits OD6–OD4 are set to 011, the returned data will reflect the programmed state of the direct input control register 133. OD6–OD4 set to 100 will mean the return data reflects the current value of the watchdog configuration register 134. For address 101, the return data will indicate the current setting of the output switching delay register 135.

The OD3 bit will reflect whether or not the switch arrangement 100 output 177 has experienced a fault condition, with a logic 1 indicating that output 177 experienced a fault condition prior to the last transition on the chip select input 157. If a fault is indicated, then the type of fault is identified by decoding bits OD2–OD0 in the next device status return output data stream in accordance with the definitions set forth in FIG. 4b and described above.

Watchdog and Fail-Safe Operation

If the fail-safe input 153 is a logic 1, then watchdog timeout detection is active when either the WAKE lead 151 or the reset input 153 transitions from logic 0 to logic 1. The watchdog timeout is a selected as one of a multiple of an internal oscillator frequency specified as described above. As long as WDIN input 169 or the watchdog bit (D7) of an incoming message is toggled within the minimum watchdog timeout period (WDTO, based on the programmed value of the watchdog control register 134), then the power management switch 100 will operate normally. If an internal watchdog timeout occurs before the watchdog bit or the watchdog input lead 169 is toggled, then switch 100 will revert to a fail-safe mode until device 100 is reinitialized. During the fail-safe mode, the output 177 will be driven on regardless of the state of the various direct inputs and modes of operation of arrangement 100. Device 100 can be brought out of a fail-safe mode by transitioning the WAKE 151 and RESET 153 inputs from logic 1 to logic 0. In the event that the WAKE input 151 does not transition to a logic 1 during normal operation and the watchdog timer times out, then power switch 100 can be brought out of fail-safe operation by bringing the reset lead 153 to a logic 0. The table of FIG. 6 summarizes the various methods for resetting the power management switch 100 from the latched fail-safe mode of operation. If the fail-safe lead 171 is tied to logic ground, then the watchdog and fail-safe operation is disabled. With reference to the table of FIG. 6, the letter S refers to the state of the output 177 of power management switch 100 as determined by the input command received at interface 102 or by direct control configurations using the main input lead 165.

With the configuration of power management switch 100 as described above, a device is presented which finds particular utility as a power switch for automotive applications and which incorporates overload protection, current limitation, short circuit protection, over temperature protection, over voltage protection, under voltage and over voltage shutdown with automatic restart and fast de-energizing of inductive loads. Additionally provided are reverse battery protection, diagnostic feedback with proportional load current sense, protection from loss of ground, open drain diagnostic output and very low quiescent current consumption in the standby mode. Additionally, such a power switch arrangement features a failure rate almost an order of magnitude lower than that of mechanical or electromechanical power switching arrangements. Devices as taught herein are suitable for loads with high inrush current, such as lamps, as well as motors and many type of resistive and inductive loads.

The invention has been described with reference to an exemplary embodiment. This embodiment is set forth for the sake of example only and is not to be interpreted as a limitation on the invention. The scope and spirit of the invention are to be derived from proper interpretation of the appended claims.

What is claimed is:

1. A programmable switch for selectively coupling an energy source to a load comprising: an interface including a shift register having a predetermined number of data stages adapted to receive Input Instructions from an external switch controller; and a plurality of addressable data registers coupled to the interface for controlling the switch in accordance with the input instructions so as to couple or uncouple the energy soure to or from the load, a first one of the plurality of addressable data register adapted to enable the external controller to program an over-current detection level at the load and a second one of the plurality of addressable data registers adapted to enable the switch controller to determine a time limit for an over-current condition at the load; another one of the plurality of addressable data registers is adapted to enable the external switch controller to program a time delay period during which the switch conduction state will be unchanged whenever the switch transitions between wake and sleep modes.

2. The switch of claim 1 wherein the interface is further adapted to send switch status data to the external switch controller.

3. The switch of claim 2 wherein the shift register includes a serial input and a serial output respectively adapted for coupling to a serial output and a serial input of the external switch controller.

4. The switch of claim 1 wherein a first subset of the predetermined number of shift register data stages forms an address of one of the plurality of addressable data registers and a second subset of the predetermined number of shift register data stages contains data used to program a preselected operational characteristic of the switch.

5. The switch of claim 1 wherein a first subset of the predetermined number of shift register data stages represents an operational status of the switch and wherein a second subset of the predetermined number of shift register data stages indicates at least one fault condition of the switch.

6. The switch of claim 1 wherein another one addressable data register is adapted to enable the switch controller to set a conduction state of the switch.

7. The switch of claim 1 wherein another one of the plurality of addressable data registers is adapted to enable the switch controller to independently control conduction states of the switch.

8. The switch of claim 1 wherein another one of the plurality of addressable data registers is adapted to enable the switch controller to program a toggle rate of a switch timer.

9. The switch of claim 5 wherein the represented operational status comprises whether the switch is in a wake or a sleep mode.

10. The switch of claim 5 wherein the represented operational status comprises whether or not the switch is in a fail-safe mode.

11. The switch of claim 5 wherein the represented operational status comprises a logic state of a switch control input.

12. The switch of claim 5 wherein the indicated fault condition comprises an over-temperature condition.

13. The switch of claim 5 wherein the indicated fault condition comprises an over-current condition.

14. The switch of claim 5 wherein the indicated fault condition comprises excess current for a predetermined time period.

15. The switch of claim 5 wherein the indicated fault condition comprises an open circuit at the load.

16. The switch of claim 5 wherein the indicated fault condition comprises less than acceptable voltage at the load.

17. The switch of claim 5 wherein the indicated fault condition comprises greater than acceptable voltage at the load.

* * * * *